United States Patent [19]

Lee et al.

[11] Patent Number: 5,472,505
[45] Date of Patent: Dec. 5, 1995

[54] APPARATUS FOR MONITORING FILMS DURING MOCVD

[75] Inventors: Bun Lee, Yusong-ku; Dug-Bong Kim, Dong-ku; Jong-Hyeob Baek, Yusong-ku, all of Rep. of Korea

[73] Assignee: Electronics & Telecommunications Research Institute, Daejeon-shi, Rep. of Korea

[21] Appl. No.: 359,198

[22] Filed: Dec. 19, 1994

[51] Int. Cl.$^6$ .................................................. C23C 14/00
[52] U.S. Cl. .................... 118/715; 117/200; 117/202; 118/712; 427/10
[58] Field of Search .................... 117/85, 86, 104, 117/200, 201, 202; 118/665, 712, 715; 427/10

[56] References Cited

U.S. PATENT DOCUMENTS

| | | | |
|---|---|---|---|
| 4,049,352 | 9/1977 | Lardon et al. | 427/10 |
| 5,009,485 | 4/1991 | Hall | 427/10 |
| 5,232,547 | 8/1993 | Drowley et al. | 117/85 |
| 5,366,556 | 11/1994 | Prince et al. | 118/722 |

*Primary Examiner*—R. Bruce Breneman
*Assistant Examiner*—Felisa Garrett
*Attorney, Agent, or Firm*—Antonelli, Terry, Stout & Kraus

[57] ABSTRACT

An apparatus for monitoring a film growth is disclosed, in which, when a crystalline thin film is grown by applying an MOCVD (metalorganic chemical vapor deposition method), the variation of the thickness and composition due to certain factors can be detected with real time during the film growing process, and an in-situ adjustment is possible. As the optical detector for detecting two sets of reflected beams which are reflected from the film, a silicon detector and a germanium detector are used, the former being suitable for detecting short wavelength laser beams, and the latter being suitable for detecting long wavelength laser beams. Thus two different wavelengths are detected with real time, thereby measuring the thickness and composition of the film.

4 Claims, 2 Drawing Sheets

APPARATUS FOR MONITORING FILMS DURING MOCVD

FIELD OF THE INVENTION

The present invention relates to an apparatus for monitoring a film growth, in which, when a crystalline thin film is grown by applying an MOCVD (metalorganic chemical vapor deposition method), the variation of the thickness and composition due to certain factors can be detected with real time during the film growing process, and an in-situ adjustment is possible.

BACKGROUND OF THE INVENTION

As the method for monitoring the growing to a film by applying an MOCVD method during the film growing process, there are the ellipsometry and the laser reflectometry.

In 1980, F. Hotter, J. Hallais and F. Simomdet disclosed a technique in which the thickness of a film can be measured with real time without carrying out simulations, and which is based on a structure and analysis far simpler than the existing complicated ellipsometry. (In-situ monitoring by ellipsometry of metalorganic epitaxy of GaAlAs-GaAs super lattice, 51(3),1599).

Meanwhile, in 1991, N. C. Frateschi, S. G. Hummel and P. D. Dapkus disclosed a film monitoring technique which resorts to a laser reflection method utilizing the variation of the interference pattern period of beams which are reflected after irradiating laser beams to a sample. (In-situ laser reflectometry applied to the growth of $Al_xGa_{1-x}As$ Braff reflectors by metalorganic chemical vapor deposition, Electronic Letter, 27, 155).

However, in these techniques, if the film grows in the normal manner, then the thickness of the film can be measured. However, if its composition is varied, the variation of the composition cannot be monitored, and therefore, it cannot be confirmed as to whether the variation of the interference pattern period of the reflected laser beams occurring during the growth of the film is due to the growth rate of the film, or due to the variation of the composition.

SUMMARY OF THE INVENTION

The present invention is intended to overcome the above described disadvantages of the conventional techniques.

Therefore it is the object of the present invention to provide an apparatus for monitoring a film growth during an MOCVD method, in which the thickness of the film and the variation of the composition of the film can be accurately monitored, so that the most suitable growth conditions call be found.

In achieving the above object, the apparatus according to the present invention includes: a first laser beam generating means for generating first laser beams having a first wavelength; a second laser beam generating means for generating second laser beams having a second wavelength different from the first wavelength; a beam splitting means for splitting the first laser beams into a proper ratio; a first filter means for allowing the first laser beams of the first laser beam generating means to pass through, for reflecting the second laser beams of the second laser beam generating means, and for irradiating the first and second laser beams to the surface of a sample disposed within a chamber of a MOCVD apparatus; a second filter means for allowing the reflected beams of the first laser beams from the sample surface to pass through, and for reflecting the reflected second laser beams from the sample surface; a first optical detecting means for detecting the reflected beams of the first laser beams from the second filter means so as to generate corresponding electrical signals; a second optical detecting means for detecting the reflected beams of the second laser beams from the second filter means so as to generate corresponding electrical signals; and an arithmetic means for receiving the electrical signals from the first and second optical detecting means to compare and analyze them.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Two sets of laser beams having different wavelengths are irradiated onto a film of a sample which is disposed on an MOCVD growing apparatus, the irradiated beams having a certain angle relative to the perpendicular direction relative to the film surface. If the periods of the interference pattern of the beams which are reflected therefrom are analyzed, the growing rate of the film can be known.

Specifically, as the thickness of the growing film is increased, the intensity of the reflected beams (i.e., the reflectivity of the beams) is varied through the interference.

Thus the period of the interference patterns of the respective beams which have varying reflectivities indicates a certain thickness.

Figure 1:
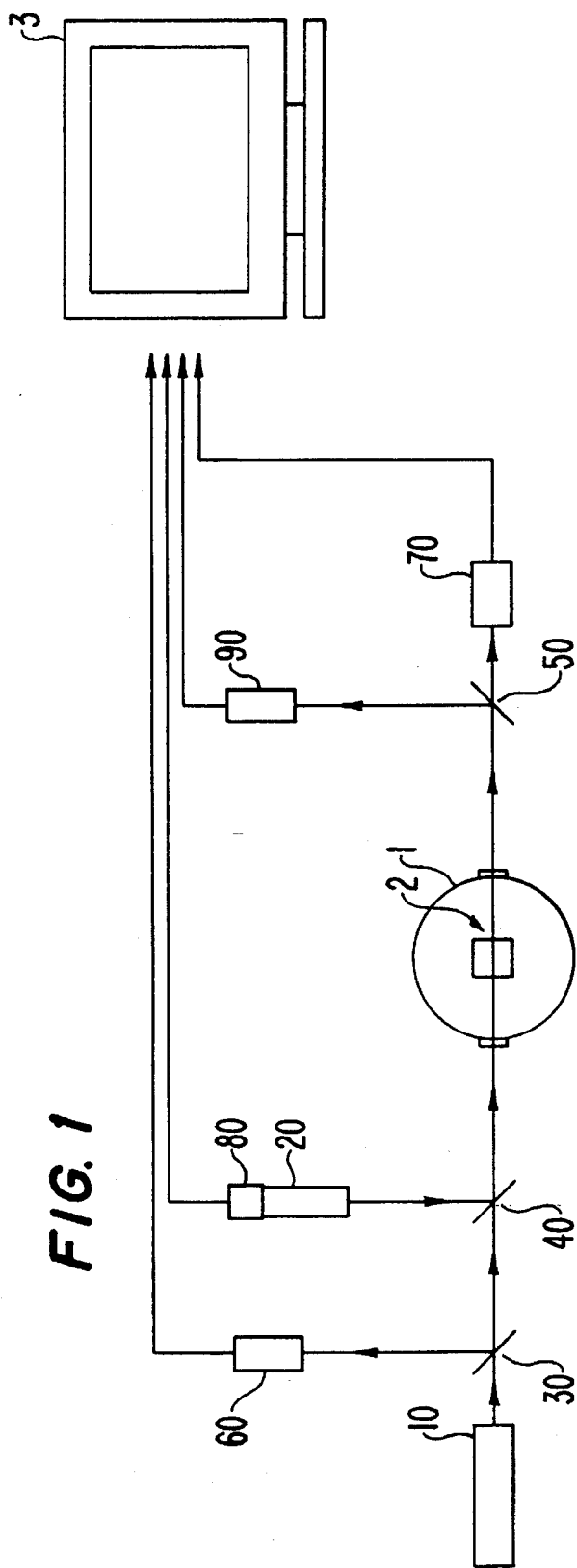
FIG. 1 illustrates the constitution of the apparatus for monitoring films according to the present invention.

FIG. 1 illustrates the constitution of the apparatus according to the present invention.

Referring to FIG. 1, reference code 1 indicates a chamber of an MOCVD apparatus in which a sample 2 is disposed, and 3 indicates a computer.

Reference codes 10 and 20 indicate respectively a first laser beam generator and a second laser beam generator, which respectively generate laser beams of certain wavelengths.

Reference code 30 indicates a beam splitter for splitting the laser beams generated by the first laser beam generator. Reference codes 40 and 50 respectively indicate a first filter and a second filter.

Reference codes 60 to 90 respectively indicate first to fourth optical detectors.

<Example>

The first laser beam generator 10 is a He-Ne laser beam generator which has a wavelength of 0.6328 μm.

The second laser beam generator 20 is a semiconductor laser diode which has a wavelength of 1.5304 μm.

The first and second filters 40 and 50 reflect beams having a wavelength of 1.5304 μm, and allows the rest of beams to pass through.

The first and second optical detectors 60 and 70 respectively consist of a silicon detector which is capable of detecting the short wavelength beams from the first laser beam generator 10.

The third and fourth optical detectors 80 and 90 respectively consist of a germanium detector which is capable of detecting the long wavelength beams from the second laser beam generator 20.

In the present embodiment, a GaAs film is formed upon a GaAs substrate within the chamber 1, and thereupon, an AlAs film is grown.

Referring to FIG. 1, the two sets of laser beams from the first and second laser beam generators 10 and 20 enter with an incident angle of 71° relative to the perpendicular direction relative to the film surface.

Two sets of beams which are reflected from the surface of the sample 2, i.e., the two sets of beams having different wavelengths (i.e., the beams from the first laser beam generator and the beams from the second laser beam generator) are supplied by the second filter 50 accurately to the second optical detector 70 and to the fourth optical detector 90 respectively.

Accordingly, the second optical detector 70 can detect the beams from the first laser beam generator 10, while the fourth optical detector 90 can detect the beams from the second laser beam generator 20.

The output signals of the respective optical detectors are inputted into a computer to be compared and analyzed.

Figure 2:
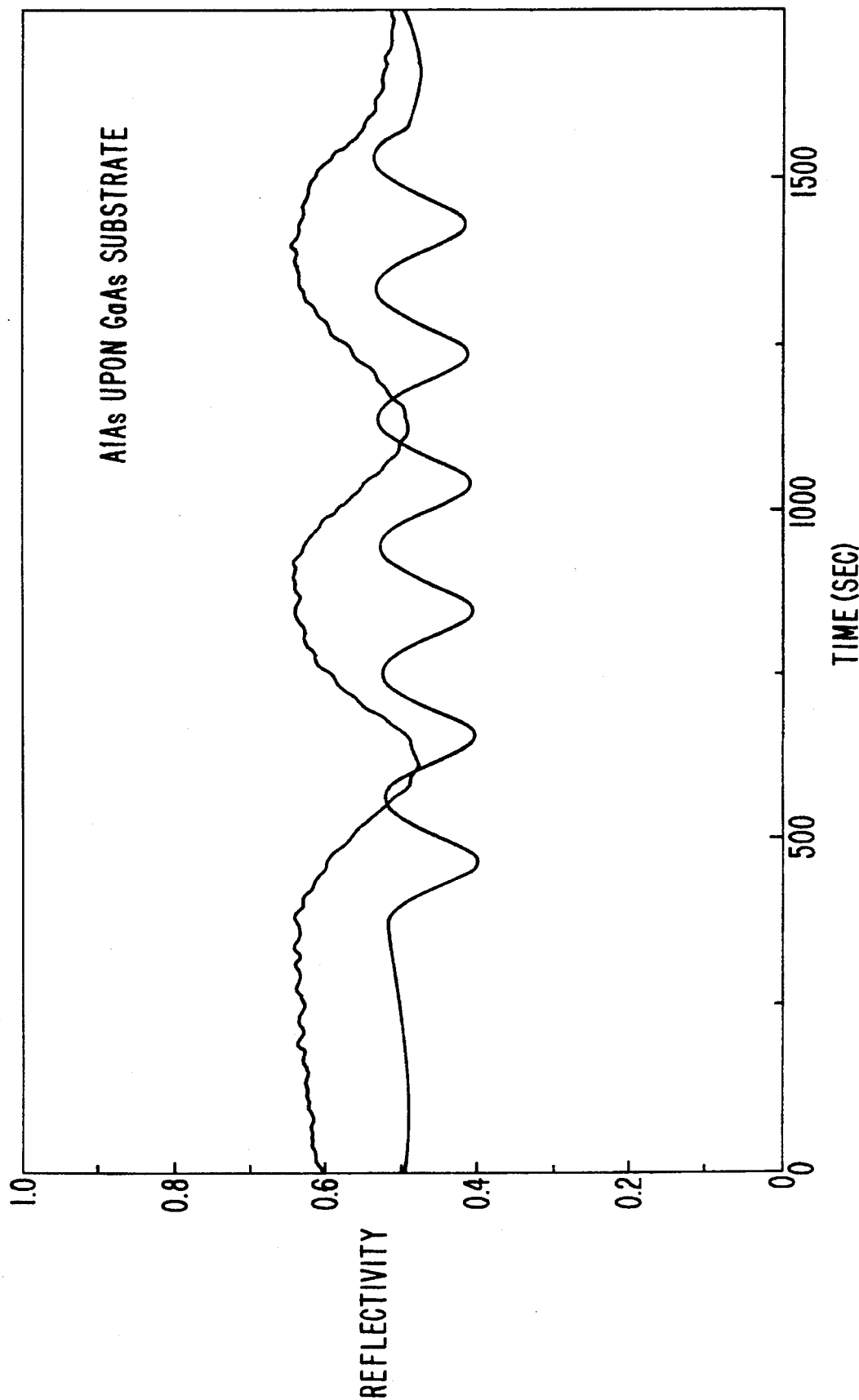
FIG. 2 is a graphical illustration showing the interference pattern of the laser beams reflected from a sample.

FIG. 2 is a graphical illustration in which the reflectivity versus the growing time is recorded. That is, the interference effect which occurs in accordance with the growth of the AlAs film on a GaAs substrate is detected through the second optical detector 70 and the fourth optical detector 90, and the result is recorded on the graph of FIG. 2.

In FIG. 2, of the two signals, the signal which is shown below, and which has a relatively smaller period of the interference pattern is the reflected beam which has a wavelength of 0.6328 μm, and which is from the first laser beam generator 10, and detected by the second optical detector 70. Meanwhile, the signal which is shown in the above, and which has a relatively larger period of the interference pattern is the reflected beam which has a wavelength of 1.5304 μm, and which is from the second laser beam generator 20 and detected by the fourth optical detector 90.

If the periods of the interference patterns which appear repeatedly become smaller gradually, then it is meant that the film growth rate is increased, while if they become larger gradually, then it is meant that the film growth rate is decreased.

If it is assumed that the periods of the interference patterns are indicated by $T_1$ and $T_2$, and that the growth rate is indicated by G, then the following relationship can be established.

$$G = \frac{\lambda_1}{2n_1 T_1} = \frac{\lambda_2}{2n_2 T_2} \quad (1)$$

In above formula, $n_1$ and $n_2$ which are sensitively varied in accordance with the composition of the grown film indicate the refractive indices of the medium for the wavelengths $\lambda_1$ and $\lambda_2$.

Therefore, if the values of the refractive indices of the medium for the relevant wavelengths can be accurately calculated, then the composition of the film can be known.

In this case, $\lambda_1$ and $\lambda_2$ are respectively 0.6328 and 1.5304 μm.

$$n_1(\lambda_1) = f(n_2, \lambda_2) \ldots (2)$$

The above formula shows that $n_1$ and $n_2$ have a functional relationship.

During the growth, if the growth conditions are altered due to certain factors, then the growth rate and the composition are varied, and the periods $T_1$ and $T_2$ of the interference patterns are altered to $T_1 + \delta T_1$, $T_2 + T_2 \delta$.

Under this condition, if a variation occurs only in the growth thickness, then $n_1$ and $n_2$ are not varied, and therefore, a linear relationship is established between the variation rates $\delta T_1$ and $\delta T_2$ based on Formula 1.

However, if there is a variation in the composition, then $n_1$ and $n_2$ are varied, and therefore, no linear relationship can be established between the variation rates $\delta T_1$ and $\delta T_2$.

By observing the variation rates of the interference pattern periods for two wavelengths, the variations of the thickness and composition can be detected based on Formulas 1 and 2.

Further, if the value of $n_1$ is known based on Formula 1, then the effective reflective index of the medium for the wavelength $\lambda_2$ can be easily known.

Based on this, the refractive index of the medium for the wavelength $\lambda_2$ at the normal temperature can be calculated.

According to the present invention as described above, relatively simple Structure and interpretation are provided compared with the conventional in-situ monitoring method. Further, the film growth thickness and composition can be known with real time during the growth of the film.

Thus the growth thickness and composition of a multi-layer film can be adjusted through a buffer-growing at the growing step of the intended structure, so that the necessary growth conditions can be found. Thus the variations of the thickness and composition which occur during the growing process can detected.

Further, if the effective refractive index for the wavelength $\lambda_1$ is known, then based on this, the effective refractive index of the medium for the wavelength $\lambda_2$ can be easily known. Then based on this, the refractive index of the medium for the wavelength $\lambda_2$ at the normal temperature can be calculated.

What is claimed is:

1. An apparatus for monitoring films during MOCVD, comprising:

a first laser beam generating means for generating first laser beams having a first wavelength;

a second laser beam generating means for generating second laser beams having a second wavelength different from said first wavelength;

a beam splitting means for splitting said first laser beams into a proper ratio;

a first filter means for allowing said first laser beams of said first laser beam generating means to pass through, for reflecting said second laser beams of said second laser beam generating means, and for irradiating said first and second laser beams to the surface of a sample disposed within a chamber of a MOCVD apparatus;

a second filter means for allowing the reflected beams of said first laser beams from the sample surface to pass through, and for reflecting said reflected second laser beams from said sample surface;

a first optical detecting means for detecting the reflected beams of said first laser beams from said second filter means so as to generate corresponding electrical signals;

a second optical detecting means for detecting the reflected beams of said second laser beams from said second filter means so as to generate corresponding electrical signals; and an arithmetic means for receiving the electrical signals from said first and second optical detecting means to compare and analyze them.

2. The apparatus as claimed in claim 1, wherein first and second laser beams are irradiated onto a sample within a chamber with an incident angle of 71° relative to the perpendicular direction relative to the surface of said sample.

3. The apparatus as claimed in claim 2, wherein said first laser beam generating means is a He-Ne laser beam generator which has a wavelength of 0.6328 μm; and said second laser beam generating means is a semiconductor laser diode which has a wavelength of 1.5304 μm.

4. The apparatus as claimed in claim 3, wherein said first optical detecting means is a silicon detector; and said second optical detecting means is a germanium detector.

* * * * *